(12) United States Patent
Locher

(10) Patent No.: US 6,507,301 B2
(45) Date of Patent: Jan. 14, 2003

(54) SIGMA-DELTA MODULATOR WITH AN ADJUSTABLE FEEDBACK FACTOR

(75) Inventor: Matthias Locher, San Jose, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/899,443

(22) Filed: Jul. 5, 2001

(65) Prior Publication Data

US 2002/0011945 A1 Jan. 31, 2002

(30) Foreign Application Priority Data

Jul. 7, 2000 (EP) .............................. 00202425

(51) Int. Cl.[7] .............................. H03M 3/00
(52) U.S. Cl. ............ 341/143; 341/136; 341/144; 341/172; 341/135; 341/142; 341/150
(58) Field of Search .............. 341/143, 144, 341/136, 172

(56) References Cited

U.S. PATENT DOCUMENTS

| | | | | |
|---|---|---|---|---|
| 4,009,475 A | * | 2/1977 | DeFreitas | 341/143 |
| 4,439,756 A | * | 3/1984 | Shenoi et al. | 341/143 |
| 4,504,803 A | * | 3/1985 | Lee et al. | 329/362 |
| 4,600,901 A | * | 7/1986 | Rabaey | 341/143 |

OTHER PUBLICATIONS

"A 0.2–mW CMOS Sigma Delata Modulator for Speech Coding with 80 dB Dynamic Range", by Eric J. van der Zwan et al., IEEE Journal of Solid–State Circuits, vol. 31, No. 12, Dec. 1996, pp. 1873–1880.

* cited by examiner

Primary Examiner—Michael Tokar
Assistant Examiner—Lam T. Mai
(74) Attorney, Agent, or Firm—Aaron Waxler

(57) ABSTRACT

In a sigma-delta modulator the feedback circuit (4, 5) has an adjustable feedback factor controlled by an adjusting member (6) for adjusting the feedback factor of the feedback circuit.

9 Claims, 3 Drawing Sheets

SIGMA-DELTA MODULATOR WITH AN ADJUSTABLE FEEDBACK FACTOR

The invention relates to a sigma-delta modulator, comprising: an integrator, a quantizer connected to an output of the integrator, a feedback circuit comprising a D/A-converter having an input connected to an output of the quantizer, and an adder having an output connected to an input of the integrator and having a first input which forms the input of the sigma-delta modulator and having a second input connected to an output of the feedback circuit.

Such sigma-delta modulators are generally known but particularly from the article: "A 0.2 mW CMOS ΣΔModulator for Speech Coding with 80 dB Dynamic Range.", IEEE Journal of Solid-State Circuits, vol. 31,No.12, December 1996.

Due to the increasing use of these circuits in a wide field of applications, a need has developed for circuits which are flexible in terms of input level, gain, process parameters, etc. From the document above it is known to vary the input level by switching of resistors in the integrator, which leads to a certain degree of flexibility in input level. However, there is also a need for flexibility in more parameters.

Therefore, the invention provides such a sigma-delta modulator, wherein the feedback circuit has an adjustable feedback factor and wherein the sigma-delta modulator includes an adjusting member for adjusting the feedback factor of the feedback circuit. These features provide adjustability of the feedback factor, which leads to a substantially better adaptability to different applications.

According to a first preferred embodiment the feedback circuit includes an attenuator which is adjustable by the adjusting member. This feature provides in a easy implement and easy to understand configuration.

According to a second preferred embodiment the adjustable attenuator concludes switched capacitors. Capacitors can be implemented more easily in an integrated circuit than resistors, so that this structure leads to less surface area on the chip, which results in lower costs.

Another embodiment has the features that the feedback circuit, the adder and the integrator are combined to a united circuit and the united circuit includes at least one adjustable current source connected to the common contact of a switch having two other contacts connected each to one terminal of a capacitor which performs the integrating function of the integrator, the switch being controlled by the D/A-converter and the adjusting member being operable to adjust the magnitude of the current delivered by said current source.

The use of a united circuit with a switch and a current source is known in this field. It provides an attractive solution for all these functions with a limited number of components. This embodiment combines these advantages with the advantages of the invention. This combination is only possible by the use of adjustable current sources, which can be realised easily.

Although other solutions, such as gradually controllable current sources are possible, an exceptionally easy solution is obtained when the current source is composed of a number of partial current sources each connected to the common contact of the switch through respective further switches which are controllable by the adjusting member. Even with a limited number of switches a wide range of currents can be controlled, which leads to a wide control range. This range can even be enlarged or refined when the current sources have mutually different current values. It is, however, also possible to use this feature to limit the number of current sources and switches.

Stability of sigma-delta modulators can be a problem in modulators with high closed loop gains. This may also be the case with the present invention when the feedback loop factor is increased. This increase may lead to such a high closed loop gain that the system becomes marginally stable or unstable.

To avoid such an undesired situation, a preferred embodiment is characterized in that the gain of the combination of the integrator and the quantizer is adjustable. These features provide an extra possibility of controlling the overall closed-loop gain so as to avoid instability.

Furthermore, control can be simplified when, as proposed in another preferred embodiment, the gain of the combination of the integrator and the quantizer is adjustable by the control member. The control of the gain of the feedback loop can then be related to the control of the gain of the rest of the closed loop. A particular adjustment strategy can then be used to avoid potentially instable situations.

An example of such an adjustment strategy is that the adjustment member is operable to control the gain of the combination of the integrator and the quantizer in such a manner that the product of their individual gain factors is constant. This strategy automatically ensures stability if the product is chosen small enough.

The preceding embodiments all relate to the adjustability of the gain factors, i.e. the situation in which the adjustments are made and are fixed during the production of the integrated circuit containing the components of the sigma-delta converter, or shortly thereafter during an initialization procedure.

The invention is, however, not limited to such a situation; it is very well possible to adjust the gain also during actual use of the circuits. In such a situation the word 'control' is used instead of the word 'adjustment'.

Therefore, in a preferred embodiment the adjusting member is adapted to continuously control the feedback factor of the feedback loop. This feature relates to the situation in which only the gain of the feedback loop is controlled. However, this feature is also applicable in a situation in which the overall closed-loop gain is also controlled. The feature that the adjusting member is adapted to continuously control the gain of the combination of the integrator and the quantizer can then be used.

The present invention will be elucidated with reference to the accompanying drawings, in which.

Figure 1:
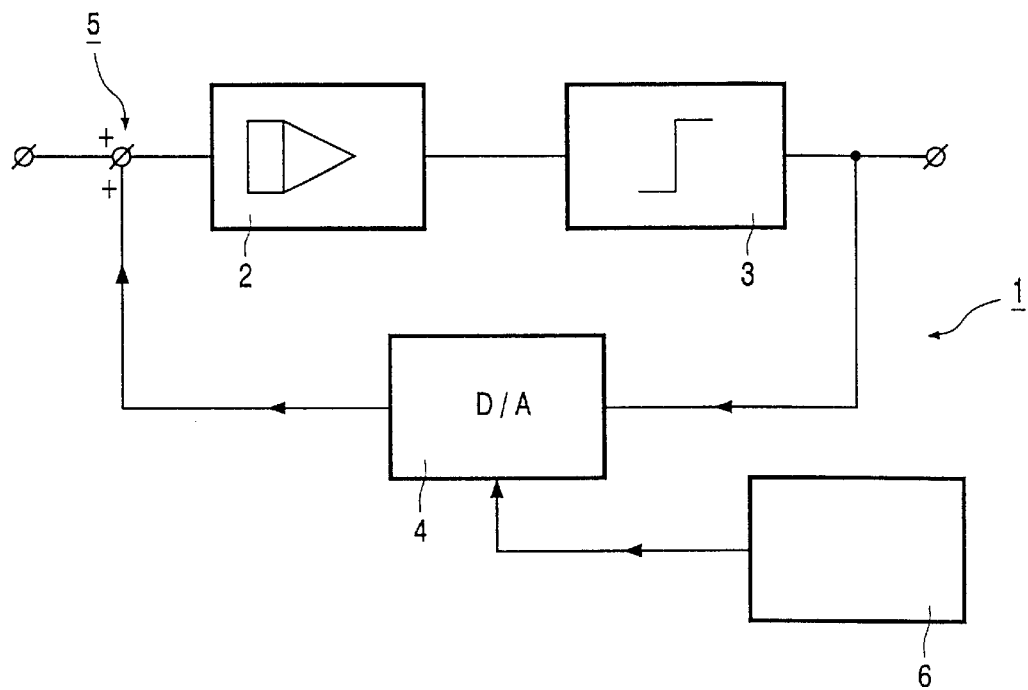
FIG. 1 shows a diagram of a sigma delta-modulator according to the principles of the invention.

FIG. 1 shows a diagram of a sigma delta modulator 1 comprising an integrator 2, which is used here as a low-pass filter, a quantizer 3, a D/A-converter (digital-to-analog converter) 4 and an adder 5. Such a sigma-delta modulator is known from the prior art, and its operation is well known.

The invention provides an adjustment of the feedback factor of the feedback loop, which in the present case includes the D/A-converter 4 and the adder 5. The adjustment is achieved by means of an adjustment member 6, which controls the gain of the D/A-converter 4. It is, however, also possible to control the gain of the feedback branch of the adder 5. This can be achieved, for example, by incorporating an attenuator in said adder or in the analog part of the D/A-converter. It is, however, also possible to use a D/A-converter which allows the adaptation of the intrinsic conversion factor between the digital and the analogue signal. As stated before, the initial adjustment may be replaced by a continuous control.

Figure 2:
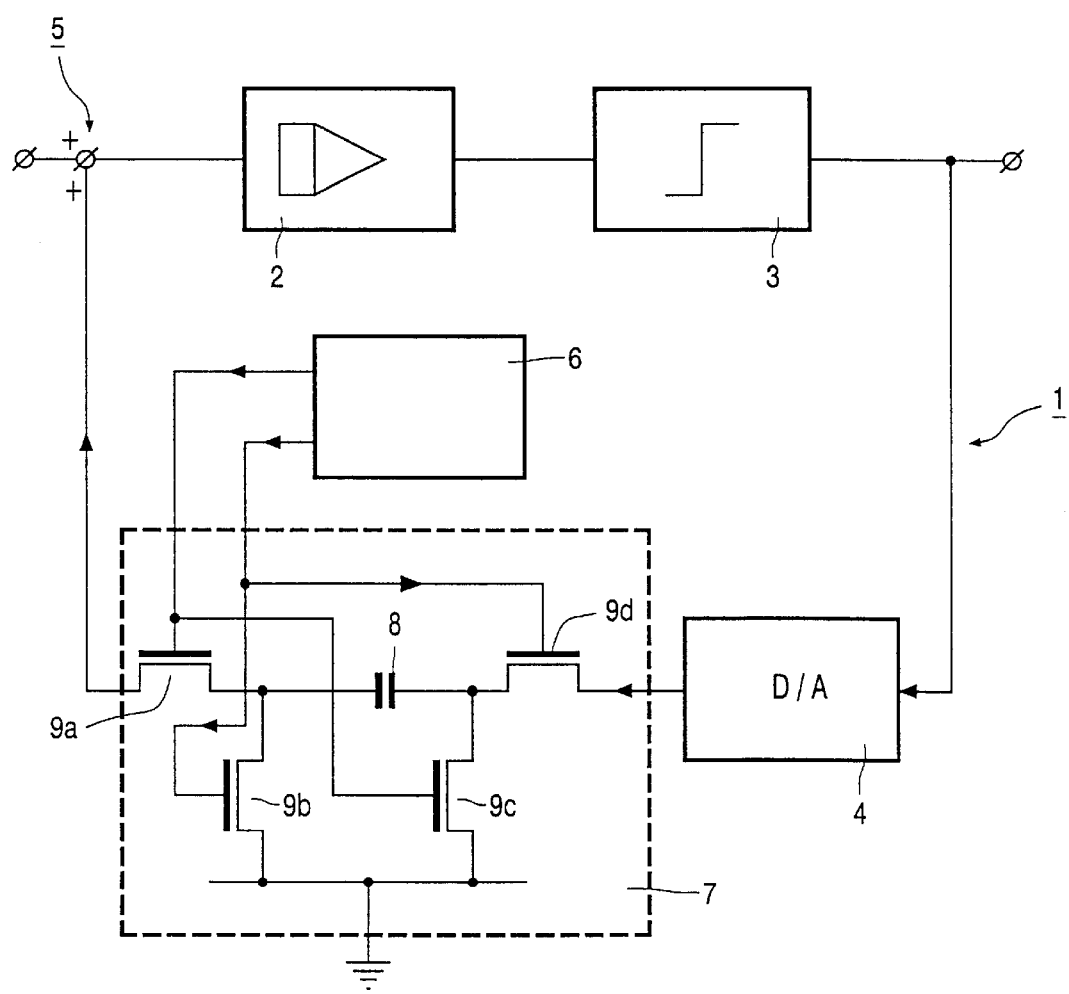
FIG. 2 shows a diagram of a first embodiment of a sigma-delta modulator according to the invention.

FIG. 2 shows a diagram of a sigma-delta modulator similar to the sigma-delta modulator shown in FIG. 1. The embodiment shown in FIG. 2 includes a separate attenuator circuit 7 in order to perform the adjustment function. The attenuator can be formed by means of a switchable resistor network, but also, as shown, by a switched capacitor network. Such a network comprises a capacitor 8, and four switches formed by FETs 9a, 9b, 9c and 9d.

The FETs are controlled in pairs 9a, 9c and 9b, 9d so that the capacitor 8 is alternately charged and discharged. The ratio between the periods of charging and discharging defines the attenuation factor. To control the FETs and thus the attenuation ratio, the adjustment circuit 6 supplies suitable driving signals to the FETs. In this case the adjustment circuit may also work only initially or continuously.

Figure 3:
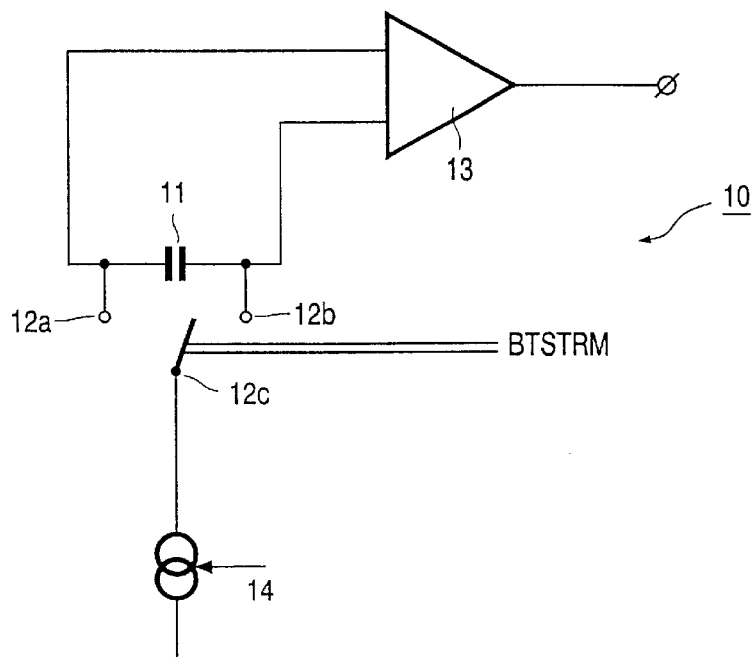
FIG. 3 shows a diagram of a second embodiment of a sigma-delta modulator according to the invention.

FIG. 3 shows a second embodiment in which the functions of the D/A-converter, the adder and the integrator are all combined in a single circuit 10. This circuit 10 comprises a capacitor 11 and a switch 12, which can be formed by means of a pair of FETs or other switching elements. The capacitor 11 is connected between the contacts 12a and 12b of the switch 12, and these contacts are connected to the inputs of an operational amplifier 13. The switch 12 is controlled by the digital signal BTSTRM present on the output of the quantizer 3. The common contact 12c of the switch 12 is connected to a current source 14. As such, said circuit is known from prior art.

According to the invention the current source 14 is a controllable current source, which makes it possible to adjust or to control the current to the switch 12 and thus the current for charging or discharging the capacitor 11. The current determines the charge collected on the capacitor 11 and hence the voltage thereon, which is fed to the inputs of the operational amplifier 13. Thus, feedback factor is controlled by adjustment or control of the current of the current source 14.

There are numerous possibilities of adjusting or to controlling the current of the current source, for example, by analog control through transistors. Another possibility is the use of a digital control. For this purpose, the current source can be divided into a number of current sources, which can each be connected to the switch 12 through a controllable switch. By adjustment or control of these controllable switches, adjustment or control of the feedback factor can be achieved.

Figure 4:
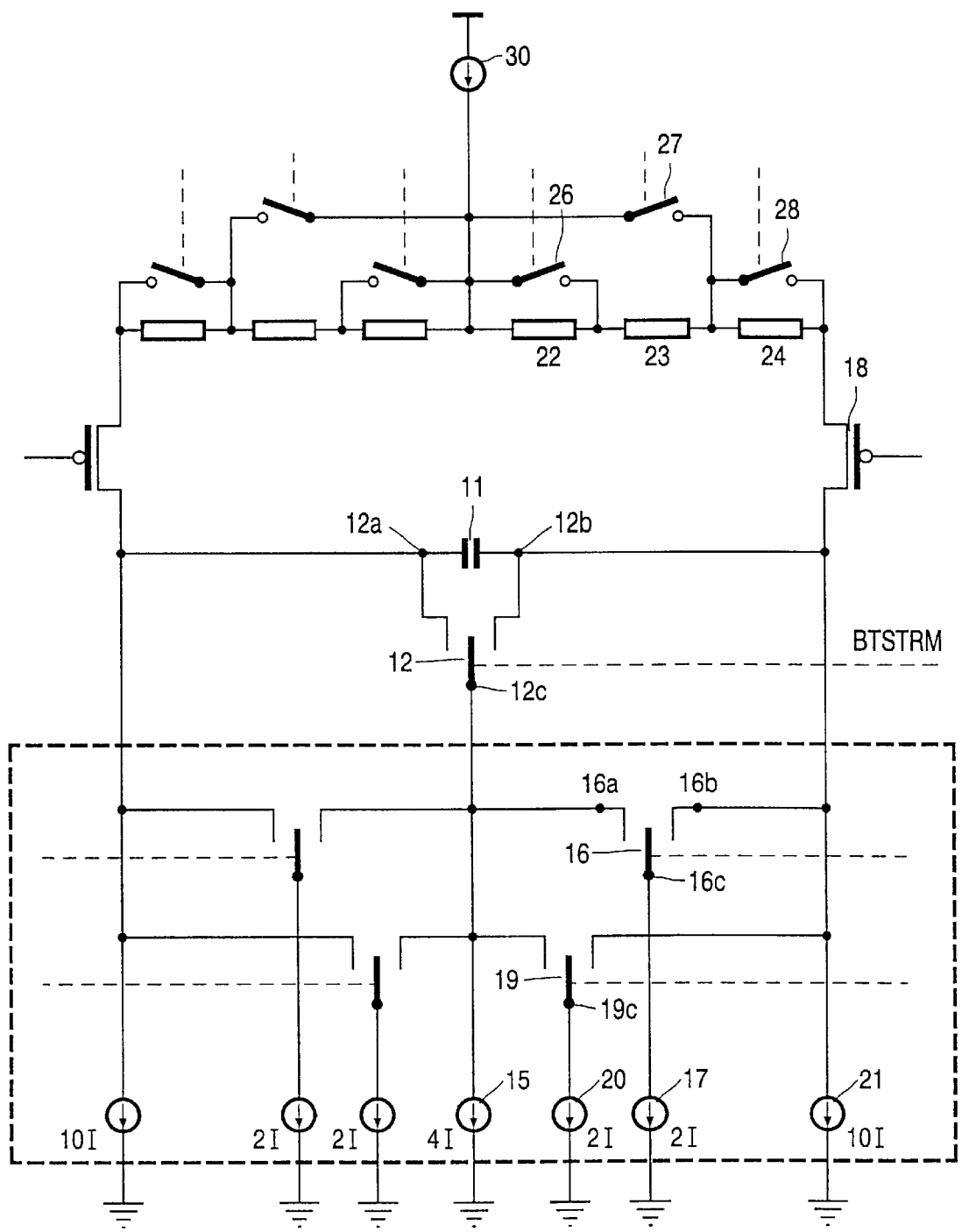
FIG. 4 shows a diagram of a third embodiment a sigma-delta modulator according to the invention.

An embodiment of such a configuration is shown in FIG. 4. Herein the contact 12c of the switch 12 is connected to a first current source 15, which supplies a current having a magnitude of 41, which is a bias current to keep the system working. Furthermore, this contact 12c is connected to a contact 16a of a first control switch 16, whose contact 16c is connected to a second current source 17, which supplies a current having a magnitude of 21. The switches can be formed by FETs or other switching components. The other contact 16b of the first control switch 16 is connected to the drain of a FET 18, which functions as an input element of the operational amplifier of the integrator. The current coming from the current source 17 will flow to the capacitor 11 or to the FET 18, depending on the position of the switch 16.

A third current source 20 has been provided, which fulfills a role similar to that of the second current source 17. Therefore, it is connected to the fixed contact 19c of a second control switch 19 which, just like the first control switch 16, is connected to the capacitor 11 and the FET 18. This second switch 19 provides another possibility of controlling the magnitude of the current for charging or discharging the capacitor 11.

Furthermore, a fourth current source 21 has been supplies, which provides a bias current to the FET 18. It is, in principle, possible to make the magnitude of the current of any of the current sources 15, 17 or 20 controllable, but usually sufficient flexibility is obtained by switching the fixed currents.

The circuit of FIG. 4 is a symmetric configuration. Therefore, the components 16,17,18,19,20 and 21 have counterparts on the 'other side' of the circuit. The function thereof will be clear.

Finally, the circuit also provides adjustability of the input gain by means of resistors 23, 24 and 25 connected in series between the FET 18 and a bias current source 30. These resistors can be short-circuited by switches 26, 27 and 28, so as to obtain different levels of attenuation. Again, the components 23 to 28 have counterparts on the other side of the circuit. In this way a double possibility of adjustment and control of signal levels is obtained.

What is claimed is:

1. A sigma-delta modulator, comprising:

an integrator, a quantizer connected to an output of the integrator, a feedback circuit comprising a D/A-converter having an input connected to an output of the quantizer, and an adder having an output connected to an input of the integrator and having a first input which forms the input of the sigma-delta modulator and having a second input connected to an output of the feedback circuit, characterized in that the feedback circuit has an adjustable feedback factor and the sigma-delta modulator includes an adjusting member for adjusting the feedback factor of the feedback circuit, and further characterized in that the feedback circuit, the adder and the integrator are combined to a united circuit and the united circuit includes at least one adjustable current source connected to the common contact of a switch having two other contacts connected each to one terminal of a capacitor which performs the integrating function of the integrator, the switch being controlled by the D/A-converter and the adjusting member being operable to adjust the magnitude of the current delivered by said current source.

2. A sigma-delta modulator as claimed in claim 1, characterized in that the feedback circuit includes an attenuator which is adjustable by the adjusting member.

3. A sigma-delta modulator as claimed in claim 2, characterized in that the adjustable attenuator includes switched capacitors.

4. A sigma-delta modulator as claimed in claim 1, characterized in that the current source is composed of a number of partial current sources each connected to the common contact of the switch through respective further switches which are controllable by the adjusting member.

5. A sigma-delta modulator as claimed in claim 4, characterized in that the current sources have mutually different current values.

6. A sigma-delta modulator as claimed in claim 1, characterized in that the gain of the combination of the integrator and the quantizer is adjustable by the adjusting member.

7. A sigma-delta modulator as claimed in claim 6, characterized in that the adjusting member is operable to control the gain of the combination of the integrator and the quantizer in such a manner that the product of their individual gain factors is constant.

8. A sigma-delta modulator as claimed in claim 1, characterized in that the adjusting member is operable to continuously control the feedback factor of the feedback loop.

9. A sigma-delta modulator as claimed in claim 6, characterized in that the adjusting member is operable to continuously control the gain of the combination of the integrator and the quantizer.

* * * * *